United States Patent [19]

Tuft

[11] 4,247,579

[45] Jan. 27, 1981

[54] METHOD FOR METALLIZING A SEMICONDUCTOR ELEMENT

[75] Inventor: Bernard R. Tuft, Scipio Center, N.Y.

[73] Assignee: General Electric Company, Auburn, N.Y.

[21] Appl. No.: 98,907

[22] Filed: Nov. 30, 1979

[51] Int. Cl.$^3$ .................. B05D 5/12; H01L 21/306
[52] U.S. Cl. .................................. 427/91; 156/643; 156/645; 156/646; 156/657; 204/192 E; 427/309
[58] Field of Search .................. 427/88–91, 427/307, 309, 250, 252; 156/643, 645, 646, 657, 662, 659.1; 204/192 EC, 192 E; 29/590, 591

[56] References Cited

U.S. PATENT DOCUMENTS

| 2,615,966 | 10/1952 | Lark-Horovitz et al. | 156/645 X |
|---|---|---|---|
| 3,075,892 | 1/1963 | John et al. | 427/89 X |
| 3,615,956 | 10/1971 | Irving et al. | 29/580 X |
| 3,795,557 | 3/1974 | Jacob | 156/646 |
| 4,056,642 | 11/1977 | Saxena | 427/88 X |

*Primary Examiner*—William A. Powell
*Attorney, Agent, or Firm*—Robert J. Mooney; Stephen B. Salai

[57] ABSTRACT

A method for forming an electrode on a semiconductor device is described. Where surface adjacent regions of differing dislocation densities are present, an initial mechanical abrading step followed by a plasma etching step produces a surface to which a metal layer may be applied with relatively uniform adherence characteristics.

9 Claims, No Drawings

METHOD FOR METALLIZING A SEMICONDUCTOR ELEMENT

This invention relates in general to the formation of electrodes on the surfaces of bodies of semiconductor material and more particularly to the preparation of such services for the application of such electrodes thereto.

In order to enable the performance of a useful function, electrical connection must be made to a semiconductor device. One method for making such an electrical connection is to provide specific metal layer or layers on such portions of the semiconductor body as to which electrical connection are required. A low resistance electrical connection may be made thereto by soldering, high pressure dry interface methods, or the like.

In order to insure that consistently good quality electrodes are formed on semiconductor surfaces, attention must be directed to the preparation of such surfaces prior to the deposition of a metal layer thereon. Heretofore, various methods of surface preparation have been employed which have commonly included surface cleaning in a concentrated acid or the like to remove impurities and to provide a surface favorable for metallization. Such wet chemical surface preparation techniques are expensive and cumbersome often requiring repeated immersions of the semiconductor device into various caustic and/or acidic solutions and also requiring multiple steps to insure the complete removal of such solutions by, for example, quenching and rinsing.

Some of the disadvantages of wet chemical processing may be eliminated through the appropriate application of plasma processing to the wafer. The use of plasmas in various forms in semiconductor device processing is illustrated for example in U.S. Pat. No. 3,195,217 wherein the application of metallic layers to a semiconductor body by a plasma jet is described. More recently, plasma processing has been employed for the removal of photoresist in semiconductor processing as well as for passivating semiconductor devices. See, for example, U.S. Pat. Nos. 3,816,196; 4,056,642; 4,104,090.

The attractiveness of plasma processing in the manufacture of semiconductor devices is due to several considerations including cost savings and higher yields, as well as environmental factors. Additionally, processing advantages such as the capability for sequential multistep processes without the necessity for handling the wafers merely through the manipulations of the plasma conditions makes automatic semiconductor device processing possible. In accordance with such processing, the semiconductor devices would remain within the plasma reactor and the sequential process would be accomplished by changing the nature of the plasma in the reactor.

One area of semiconductor device processing in which plasma techniques appear not to have thus far been employed is in the preparation of semiconductor surfaces for the application of electrodes thereto. In order to achieve a high quality ohmic contact to a diffused silicon surface which contact is easily manufactured and which meets the required device specifications such as low resistance contact to the wafer and strong mechanical adherence thereto, and has good reliability, the following conditions inter alia are required. The depletion region at the silicon surface prior to contact application must be removed. A roughened silicon surface such as that provided by mechanically abrading the surface preparation must be provided in order to insure good mechanical adherence between the contact material and the silicon surface. The silicon surface must be free of organic and inorganic impurities as well as oxides and moisture.

While plasma etching alone is capable of providing a semiconductor surface for metallization which exhibits the above-identified preferred characteristics, it has been observed that the surface conditions of the semiconductor device depend not only upon the time and conditions of the plasma etching step, but also upon the nature of the semiconductor region, the surface of which is subjected to the plasma process. Some surfaces, therefore, may require different conditions of plasma etching than others in order to achieve the same ultimate surface conditions for bonding. While it is relatively easy to adjust the plasma conditions to provide the desired semiconductor surface conditions where a single type of semiconductoor region with regard to conductivity type concentration, and the like, is being prepared, in some instances more than one such region is preferably simultaneously prepared in a single plasma step. For example, certain bilateral triode thyristors such as triacs include a single electrode which bridges two surface adjacent semiconductor regions of different conductivity types and surface concentrations. The plasma etching of the surface including these distinct regions result in a degree of nonuniformity which adversely affects electrode application thereto.

Therefore, it is an object of this invention to provide a method for the preparation of a semiconductor surface for the application of an electrode thereto which method includes the step of plasma etching the surface as well as the preliminary step of abrading the surface preparatory to the plasma etching to introduce dislocations which enhance the etching rate of the plasma.

It is another object of this invention to provide a method for simultaneously preparing a semiconductor surface including regions therein of different surface impurity concentrations which method includes the step of plasma etching the surface and also includes the preliminary step of abrading the surface prior to plasma etching so that upon plasma etching a uniform surface is provided.

Briefly stated and in accordance with one aspect of this invention, a method for preparing a semiconductor surface including first and second surface adjacent regions at different surface impurity concentrations includes the steps of grit dusting the surface, then simultaneously etching the entire surface in a plasma followed by depositing a metal layer on the etched surface.

Normally, where p-type and n-type regions of high surface concentration are employed, the n-type region has a slightly higher surface concentration than the p-type region and, therefore, the number of dislocations introduced into the silicon lattice by diffusion is generally greater than the number introduced by the p-type dopant. It has been discovered that when two such regions are simultaneously exposed to a gaseous plasma for surface preparation that independent of the plasma condition including the time of plasma etching, the p-conductivity type region exhibits an ultimate surface roughness which is less than the ultimate surface roughness of the n-conductivity type region. When a metal layer is thereafter applied to the plasma etched surface, the degree of adhesion to the p-type surface region is less than that to the n-type surface region and failure of the device through separation of the metal layer therefrom is possible. It might be expected that by some sort of pre-etching treatment of the p-conductivity type region, a more uniform surface could be produced. Such a pre-etching step would require masking of the n-conductivity type region and selective exposure of the adjacent p-conductivity type region to a pre-etch treatment. This procedure leads to the increased possibility of processing misalignment and the like and, consequently, is not to be preferred. It has been discovered, quite unexpectedly, that by lightly abrading the entire surface to which a contact is desired to be applied, that is to say, both the p and the n-conductivity type regions, followed by plasma etching of the entire surface, that a uniform surface roughness is provided. Upon the subsequent application of a metal layer to the plasma etched surface, a uniform degree of adherence is obtained. In accordance with a presently preferred aspect of this invention, the surface to which contact is desired to be made is abraded by a lightly grit dusting with fine optical powder as will be more thoroughly described hereinbelow. The effect of grit dusting prior to plasma etching is somewhat unexpected inasmuch as grit dusting does not appear to effect the p and the n-conductivity type regions equally which would result in maintaining the difference in surface roughness after the plasma etch step, but rather results in elimination in difference of roughness heretofore experienced by plasma etching alone. The features of the invention which are believed to be novel are pointed out with particularity in the appended claims. The invention itself, however, both as to its organization and method of performance together with further objects and advantages thereof may best be understood by reference to the following description. The silicon device is prepared up to the point where metal electrodes are applied according to techniques well known to those skilled in the art such as mask diffusion, groove etching for passivation, glass deposition, and the like. Those areas to which a metal contact is to be applied are defined by a mask which is preferably a photolithographic mask as is quite commonly employed for masked diffusion. Those areas where metal contacts are desired are open, and those other areas including glass grooves and the like are masked by the photoresist. Such techniques are well known and no deviation from techniques known by those skilled in the art is required for practicing this invention. Preferably, the photoresist has a thickness of about 60–80 KÅ and may be made of any material which X is not unduly affected by grit dusting or by plasma etching.

Where contacts are decided to be applied to both sides of a semiconductor wafer, such as a diode, transistor, thyristor, or bidirectional triode thyristor, all the following steps may be simultaneously performed on both sides of the wafer. Grit dusting is accomplished by directing a stream of particles at the surface of the semiconductor device. While grit dusting itself is a well known technique and may be employed in accordance with this invention without special modification, it is preferred to employ a grit dust prepared as follows: sieve a quantity of No. 250 Optical Powder through a 74-micron screen, place the sieved powder in an oven at about 160° C. for a period of at least one and one-half hours, store the grit in closed containers until ready for use. The grit dust thus prepared is directed in a stream against the surface of the semiconductor wafer. After grit dusting, the surface should have a dull grey appearance rather than the shiny metallic appearance prior to grit dusting. Only a light grit dusting is required by this invention, a few seconds per side being adequate. A convenient method for determining the amount of grit dusting required is to weigh the wafers prior to and subsequent to the grit dust step. It is preferred that about 0.03–0.07 mils of silicon be removed, the weight being a function of the diameter of the wafer, the calculation of which is well within the cognizance of one skilled in the art. After grit dusting, the wafers are cleaned, for example, by rinsing in deionized water and then baked in nitrogen at about 140° C. for about 10 minutes. The wafers are now ready for plasma etching. While any plasma which will etch the grit dusted silicon surface while not attacking the masked silicon surface may be employed, it has been found that carbon tetrafluoride, $CF_4$, which may be purchased under the trade name Freon-14, which is available from Dupont Corporation, is advantageously employed. Preferably, the plasma also contains a small amount of oxygen. A preferred gas is described in U.S. Pat. No. 3,795,557. Increasing the oxygen content of the plasma increases the degree of reaction with the photoresist masking material, but, at the same time, slows the etch rate of silicon and increases the degree of control thereof. It has been found that an oxygen content of about four percent is preferred in accordance with this invention.

In the alternative, other plasma may be employed such as $SIF_4$ also including about four percent of oxygen.

The plasma conditions and the time of etching may be varied to increase the rate of etch while decreasing the time therefor, or vice versa, according to principles well known to those skilled in the art. It has been found, however, that an etch having a duration of about five minutes at a temperature of about 75° C. is preferred in accordance with this invention. The plasma conditions are to some extent dependent on the number of wafers being etched as is well known to those skilled in the art. The conditions hereinabove described are appropriate for about 50 wafers in a 10-inch diameter, 18-inch long chamber. The plasma conditions should be adjusted so that the depletion region at the silicon surface is removed prior to contact application, the surface has a degree of roughness which provides, for the particular metallization employed, suitable roughness to insure good mechanical adherence to the surface, and finally that the surface is free of organic and inorganic materials, oxides, and moisture. As heretofore mentioned, between 0.03 and 0.07 mils were removed during the grit dust operation and the plasma etch conditions should be established to remove between about 0.04 and 0.07 mils. It is preferred that the total amount of material removed by the mechanical abrading and plasma etching steps be sufficient to remove any depleted surface layer but not so much as to significantly reduce the surface impurity concentration of the device.

The devices are ready for the appliation of metallic contacts thereto immediately after removal from the plasma reactor. Where it is necessary to store the wafers after plasma etching, it is preferred that the same be stored in an inert atmosphere such as dry nitrogen until ready for plating. It is further preferred that no more than about two hours be allowed to elapse between the plasma etching and the plating.

Vapor plating provides a preferred method for the application of metal electrodes to semiconductor devices processed in accordance with this invention. While the surface preparation technique hereinabove provides a surface which is suitable for the application for a variety of metallizations thereto, it has been found that chrome-nickel-silver electrodes are advantageously employed.

While certain preferred embodiments of a method for forming an electrical contact on the surface of a semiconductor body having more than one surface adjacent a semiconductor region of different impurity concentration and/or different impurity type has been described in accordance with a presently preferred embodiment thereof, certain modifications and changes will occur to one skilled in the art. For example, a method has been described for simultaneously forming an electrode on the surface adjacent p and n-type regions such as are found in a bi-directional triode thyristor (triac). Other examples of semiconductor devices where opposite conductivity type regions are divided to be provided with metal electrodes simultaneously, include the cathodes and gates of SCR's, the emitter regions of any thyristor wherein emitter shorts are provided which rely upon the termination at the service of the device of regions of opposite conductivity type. Accordingly, such modifications and changes as lie within the true spirit and scope of this invention as defined by the appended claims are intended to be included therein.

What is claimed is:

1. In a method for making a semiconductor device having a metal electrode thereon, the steps of:
    mechanically abrading the surface of the semiconductor device;
    plasma etching said surface; and
    applying said metal electrode.

2. In a method for making a semiconductor device characterized by first and second regions therein of different impurity concentrations, the steps of:
    simultaneously mechanically abrading the surfaces of said first and second regions;
    simultaneously plasma etching said surfaces; and
    applying a metal layer to said surfaces.

3. A method for making a semiconductor device comprising:
    forming a semiconductor body having first and second regions therein of different impurity concentration, said regions each including a surface portion;
    mechanically abrading the surface portions of each region;
    simultaneously plasma etching said surface portions;
    applying a metal layer to said surface portions.

4. The method of claim 3 wherein said mechanically abrading comprises grit dusting said surface portions.

5. The method of claim 3 wherein said first and second regions comprise regions of opposite conductivity type.

6. In a method for forming a semiconductor device characterized by first and second coplanar regions of different dislocation density, the steps of:
    mechanically abrading said regions to equalize the dislocation densities therein
    simultaneously plasma etching said regions; and
    applying a layer of metal to each of said regions whereby the adherence of the metal layer is essentially uniform as to the first and second regions.

7. In a method for forming a semiconductor device characterized by first and second surface adjacent regions of different conductivity determining impurity type, the improvement comprising:
    simultaneously abrading the surfaces of the first and second regions
    simultaneously plasma etching said surfaces;
    simultaneously apply a layer of metal to said surfaces, said layer of metal adhering equally to said first and second regions.

8. The method of claims 1, 2, 3, 4, 5, 6, or 7 wherein said plasma etching comprises etching in a fluorine plasma.

9. The method of claims 1, 2, 3, 4, 5, 6, or 7 wherein said plasma etching comprises etching in a fluorine plasma including a few percent of oxygen.

* * * * *